United States Patent [19]
Fujimoto et al.

[11] Patent Number: 5,933,350
[45] Date of Patent: Aug. 3, 1999

[54] SEMICONDUCTOR DEVICE DEVELOPMENT INFORMATION INTEGRATING SYSTEM

[75] Inventors: Shinichi Fujimoto, Tokyo; Mitsuhiro Matsuura, Kawanishi; Masaaki Kakihara, Amagasaki, all of Japan

[73] Assignee: Mitsubishi Denki Kabushiki Kaisha, Tokyo, Japan

[21] Appl. No.: 08/825,110

[22] Filed: Mar. 27, 1997

[30] Foreign Application Priority Data

Sep. 3, 1996 [JP] Japan .................................. 8-232865

[51] Int. Cl.$^6$ .................................................. G06F 19/00
[52] U.S. Cl. ............................... 364/468.28; 364/468.02; 364/490
[58] Field of Search .................. 364/468.02, 468.28, 364/468.03–468.1, 474.24, 488–491, 578; 345/964; 707/1–10, 100, 102, 104

[56] References Cited

U.S. PATENT DOCUMENTS

| 5,089,970 | 2/1992 | Lee et al. | 364/468.02 |
| 5,231,585 | 7/1993 | Kobayashi et al. | 364/468.02 |
| 5,425,036 | 6/1995 | Liu et al. | 364/488 X |
| 5,644,493 | 7/1997 | Motai | 364/468.02 |
| 5,778,386 | 7/1998 | Lin et al. | 707/1 X |

FOREIGN PATENT DOCUMENTS

| 61-267052 | 11/1986 | Japan . |
| 1-260578 | 10/1989 | Japan . |
| 3-282546 | 12/1991 | Japan . |
| 8-63382 | 3/1996 | Japan . |

*Primary Examiner*—Joseph Ruggiero
*Attorney, Agent, or Firm*—Leydig, Voit & Mayer

[57] ABSTRACT

A semiconductor device development information integrating system comprises a semiconductor device information management system that stores and manages electronic data of photomask specifications created in a semiconductor device design process and electronic data of manufacture process steps created in a semiconductor device manufacture process as integrated semiconductor device information integrated into at least one database; a semiconductor device design electronic terminal that issues a request to said management system to call and display said integrated semiconductor device information and, based on which information, creates and edits design data; a semiconductor device manufacture electronic terminal that issues a request to said management system to call and display said integrated semiconductor device information and, based on which information, creates and edits manufacture data; and a semiconductor device manufacture system for manufacturing the semiconductor device based on said manufacture data. It is therefore unnecessary to perform manual condition settings to automated systems, leading to labor saving in the semiconductor device design and manufacture sections.

9 Claims, 15 Drawing Sheets

Fig.4 (a)

CLOSE VAX2 Print Option PassWord                                    MM01AA.WPR Canceled                                    mm01a Mask List Edit

| Gal 1 | Name | | TEL | 465 | DATE | 96.03.06 | >MM01AA.WPR | MM01AE.WPR | MM01AI.WPR |

Msk Set Name | MM01A | Chip Size X | 7980 | Chip Size Y | 8000 | MM01AB.WPR | MM01AF.WPR | MM01AJ.WPR List From ∨ Library ◆ Property | ■ Cell Size Editable | ┘ MaskList Last Version Cancel | MM01AC.WPR | MM01AG.WPR | MM01AK.WPR Shot Cell Name | Chip Size X | Chip Size Y | Recovery | UNDO | MM01AD.WPR | MM01AH.WPR | MM01AL.WPR

| MM01AAA | 7980 | 8000 | Add | Delete | Final Check |
| MM01ATA | 7980 | 8000 | Add | Delete |
| MM01AMA | 7980 | 8000 | Add | Delete |
| MM01ASA | 7980 | 8000 | Add | Delete |
| MM01AYA | 17200 | 17240 | Add | Delete |

| All | KInd | MaskSet | Ovr | Layer | Sub | Res | R/N | M.S | A.U | MIR | um | | Equiv Opt | JB | | AI | DI | Version All On Off All On Off
| Copy Delete | 1 | MIR | M- MM01A | -P4 | 39 | -A | P | S | 5 | 5 | 0.5 | NO | 3 ±0.2 | ... | CORE | | ABCDEFGH IJKL PLOT
| | a | b | c | d | e | f | g | h | i | j | k | l | m | n

Fig.4 (b)

~X1 ~X2 ~X3 ~X4
(("Ga1" "mmatuura" "465" "96.02.27")
~X5  ~X6 ~X7  ~X8     ~X9  ~X10   ~X11    ~X12 ~X13  ~X14   ~X15 ~X16
(("mm01aaa" "7980" "8000" )("mm01ata" "7980" "8000")("mm01ama" "7980" "8000")("mm01asa" "7980" "8000")
~X17
("96.02.21")
~X18 ~X20      X22 X24  X26   X28    X30         X32
(("MIR" "M-" "P4" "39" "A" "P" "R" "5" "5" "0.5" "NO" "3.00" "0.2" "" "G1" "CORE" "" "(nil)""")
 X19 X21 X23 X25 X27 X29 X31

Fig.7

| NO. | Sub process | Mask name | Check coordinate | Recipe | Person in charge |
|---|---|---|---|---|---|
| 0021 | Resist coating | | | HL345 | ○○○○○ |
| 0022 | GBH exposure | M-MM01A-P439-AP | | TPP | ○○○○○ |
| 0023 | Development | | 1234.4  566.5 | RHJK | ○○○○○ |
| 0024 | Development check | | | KJ898 | ○○○○○ |
| 0025 | Post-bake | | | HH999 | ○○○○○ |
| 0026 | LK removal | | | JK876 | ○○○○○ |

A                                      B

Results ************************************

| Desired thickness | 1.5 μm |
|---|---|
| Resulting thickness | +0102   1.0 μm |
| Desired certain thickness | 1.05 μm |
| Resulting certain thickness | 1.37 |
| Desired certain resistance | 1.41 |
| Resulting certain resistance | |

Fig.16 (a)   Prior Art
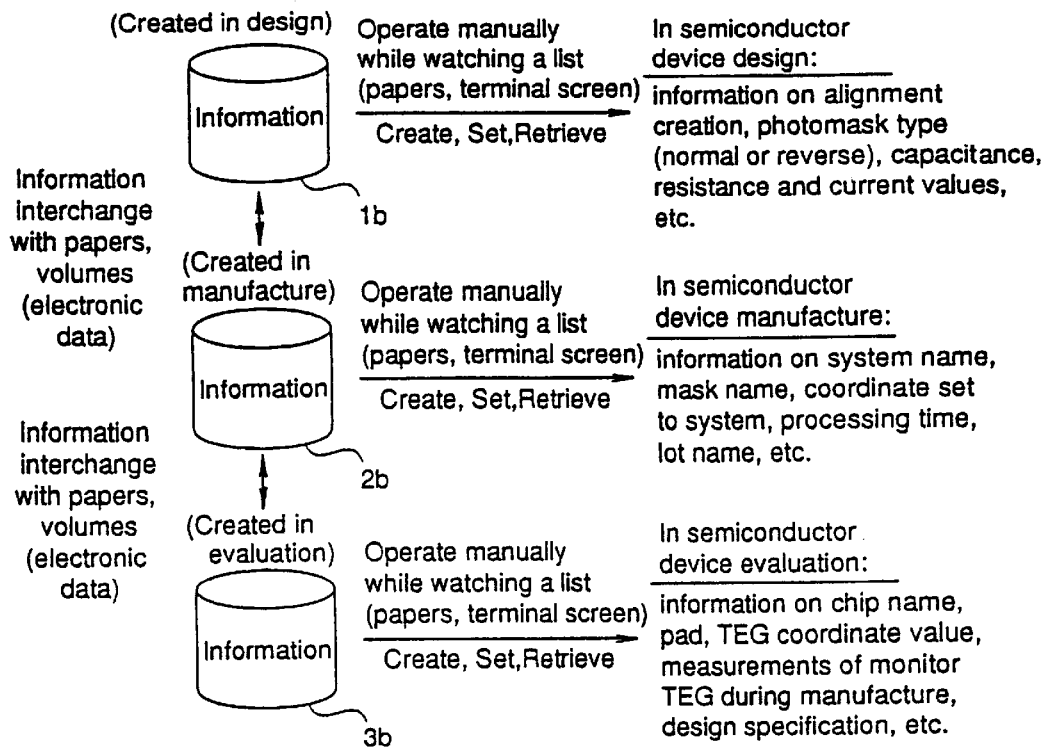
Fig.16 (b)
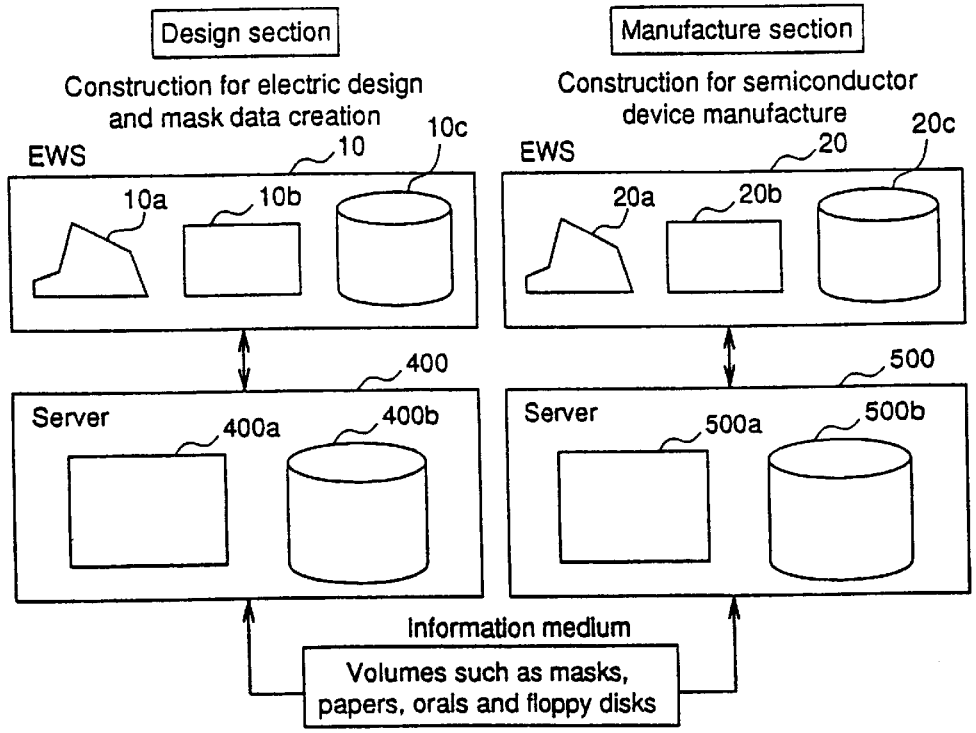

SEMICONDUCTOR DEVICE DEVELOPMENT INFORMATION INTEGRATING SYSTEM

FIELD OF THE INVENTION

The present invention relates to a semiconductor device development information integrating system and particularly to one that creates and edits conditions for automated systems in semiconductor device design, manufacture and evaluation. The invention relates, more particularly, to a semiconductor device development information integrating system that integrates databases of design and manufacture information for setting conditions for automated systems, to eliminate manual information interchange.

BACKGROUND OF THE INVENTION

Semiconductor device design and manufacture processes are separated by the delivery of photomasks, and the automation in both have been advanced, individually. The reason for this is that the automated systems for semiconductor device design and for semiconductor device manufacture have been specialized, and the former and the latter have been generally dealt with by different vendors. Hence, information modes often differ from each other. Even vendors who deal with both may be unfamiliar with both automations. This may cause difficulties in utilizing shared information.

Recently in semiconductor device manufacture section, there has been almost attained paperless process management tables in clean rooms. On the other hand, the integration of electronic data for information interchange between semiconductor device manufacture and design sections is slow.

A description will be given of a method of information interchange among the respective sections in conventional semiconductor device development. FIGS. 16(a) and 16(b) illustrate a mode of information interchange among design, manufacture and evaluation sections in conventional semiconductor device development. In FIG. 16(a), there are shown a database 1b that stores information created at the design section, a database 2b that stores information created at the manufacture section, and a database 3b that stores information created at the evaluation section.

Referring to FIG. 16(b), an engineering workstation (EWS) 10 in the design section has a graphic terminal 10a, a memory 10b and a submemory 10c. A server 400 in the design section has a memory 400a and a submemory 400b. An EWS 20 in the manufacture section has a graphic terminal 20a, a memory 20b and a submemory 20c. A server 500 in the manufacture section has a memory 500a and a submemory 500b.

Normally the semiconductor device development section has such a development support system as described. The development of semiconductor devices is carried out utilizing the development support system in the following manner.

The design information created at the design section is stored in the database 1b implemented on the server 400. In the design section, as required, information requisite for semiconductor device design, such as alignment creations, photomask type, i.e., normal or reverse, capacitance values, resistance values and current values, is created, set and retrieved by watching a list, e.g., papers and terminal screens, which list is retrievable from the EWS 10.

Manufacture information created at the manufacture section is stored in the database 2b implemented on the server 500. In the manufacture section, as required, information requisite for the semiconductor device manufacture, such as systems to be used, mask names, coordinates to be set on the systems, processing time and lot names, is created, set and retrieved by watching a list, e.g., papers and terminal screens, which list is obtainable from retrievals using the EWS 20.

Manufacture information created at the evaluation section is stored in the database 3b implemented on a server (not shown). In the evaluation section, as required, information requisite for the semiconductor device evaluation, such as chip names, pads, coordinate values of test element groups (TEGs), measurements of monitor TEGs during manufacture and design specifications, is created, set and retrieved by watching a list, e.g., papers and terminal screens, which list is retrievable from an EWS (not shown).

It should be noted that the databases 1b, 2b and 3bhave no data link with one another. Therefore, in a case where the design section requires information possessed by the manufacture and evaluation sections, such information is printed out and then input by manual operation, thereby performing information interchange. Alternatively, the information interchange by electronic data necessitates volumes, e.g., floppy disks, as a media.

FIG. 17 shows a development process in a conventional semiconductor device development section. In step S1a, information needed in design, such as resistances, capacitances, FETs, substrates, is acquired through papers or electronic data existing separately, thereby obtaining manufacture information. In step S2, electric design is executed using the manufacture information obtained in step S1a. In step S3, mask data design is executed. In step S4, the mask making is executed. In step S5a, the design information on chip sizes, mask names, mask arriving dates, specific data areas and target performances, is acquired from papers or a separate electronic data. In step S6, the mask manufacture is executed using the design information obtained in step S5a.

The information interchange in the semiconductor device design section of the prior art system is performed in the aforementioned manner. More specifically, in the design process of the semiconductor device development, the electric design is executed by simulators, whereas the setting of conditions for the simulators requires information from the manufacture and evaluation sections. Such information is, however, not integrated with the information of the design section. Hence, fragmental information on each semiconductor device type must be described on papers or converted into volumes or the like, followed by the respective manual setting.

As discussed above, although most of the information possessed by the design section of the semiconductor device development is electronic data, the problem attendant to interfaces persists. Thus it is necessary that the information which has been converted into papers or volumes be delivered to the manufacture section to set the data by manual operation, i.e., manual input work.

Consequently, a mere interface of the information calls for the manual work, causing a hindrance to cost reduction in semiconductor device manufacture.

SUMMARY OF THE INVENTION

It is an object of the present invention to provide a semiconductor device development information integrating system that realizes noticeable automation and labor saving in semiconductor device manufacture by integrating databases storing design and manufacture information.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor device development information integrating system comprises a semiconductor device information management system that stores and manages (i) electronic data of photomask specifications created in a semiconductor device design process and (ii) electronic data of manufacture process steps created in a semiconductor device manufacture process, as integrated semiconductor device information integrated into at lease one database; a semiconductor device design electronic terminal that issues a request to said management system to call and display said integrated semiconductor device information and, based on which information, creates and edits design data; a semiconductor device manufacture electronic terminal that issues a request to said management system to call and display said integrated semiconductor device information and, based on which information, creates and edits manufacture data; and a semiconductor device manufacture system for manufacturing the semiconductor device based on said manufacture data.

It is therefore unnecessary to perform manual condition settings to automated systems, leading to labor saving in the semiconductor device design and manufacture sections.

According to a second aspect of the present invention, a semiconductor device development information integrating system comprises a semiconductor device information management system that integrates (i) a list produced by converting photomask specifications created in a semiconductor device design section into electronic data (ii) instructions produced by converting manufacture process steps created in a semiconductor device manufacture section into electronic data and (iii) a list produced by converting an interim evaluation in a semiconductor device manufacture process into electronic data, into at lease one database, to store and manage as integrated semiconductor device information; an electronic terminal that issues a request to said management system to call said integrated semiconductor device information, said terminal displaying said device information on a screen of said terminal as a sheet menu and a form menu, process by process and per string/page, to create and edit data on said screen by persons of the semiconductor device design and manufacture sections; a CAD system of the semiconductor device design section, said CAD system receiving said integrated semiconductor device information when said request is issued; and a semiconductor device manufacture system receiving said integrated semiconductor device information when said request is issued.

It is therefore unnecessary to perform manual condition settings to automated systems, leading to labor saving in the semiconductor device design, manufacture and evaluation sections.

According to a third aspect of the present invention, the semiconductor device development information integrating system of the second aspect has a feature that in a semiconductor device design, said CAD system acquires, from said database, (i) information on accuracies and the normal/reverse photomask type, which information being requisite for the semiconductor device manufacture section and (ii) information on the types of alignment marks and the alignment sequences of photomasks, which information being requisite for systems used in photolithographies in the semiconductor device manufacture, thereby executing patterning automatically.

It is therefore unnecessary to perform manual condition settings to automated systems, leading to labor saving in the semiconductor device design, manufacture and evaluation sections. In addition, the automatic patterning permits further labor saving.

According to a fourth aspect of the present invention, a semiconductor device development information integrating system of the second aspect has a feature that in a semiconductor device design said CAD system acquires, from said database, process rules such as wire widths and inter-wire gaps, which rules being requisite for the semiconductor device manufacture section, to create and execute verification rules automatically.

It is therefore unnecessary to perform manual condition settings to automated systems, leading to labor saving in the semiconductor device design, manufacture and evaluation sections. In addition, the automatic generation of the verification rules permit further labor saving.

According to a fifth aspect of the present invention, a semiconductor device development information integrating system of the second aspect has a feature that in a semiconductor device manufacture said semiconductor device manufacture system captures, from said database, information on the arriving dates of manufactured masks, the controls of mask automatic transportation systems, the designations of drawing systems, the management of the processes, the management of the processing time, the management of the progress states, numerical settings to said manufacture system according to graphic areas existing in a range designated by a specific mask, said manufacture system computing the designations of coordinates of check patterns by referring to CAD data and coordinates on a wafer after being subjected to photolithographies.

It is therefore unnecessary to perform manual condition settings to automated systems, leading to labor saving in the semiconductor device design, manufacture and evaluation sections. In addition, the information acquisition from the database and the coordinate designations of the check patterns thus computed permit further labor saving.

According to a sixth aspect of the present invention, a semiconductor device development information integrating system of the second aspect has a feature that in a semiconductor device design said CAD system calls, from said database, the environment in which back annotations from check data of after/during manufacture process steps to a designer is performed, process by process and systematically along with photomasks, thereby executing resimulations from the manufacture results.

It is therefore unnecessary to perform manual condition settings to automated systems, leading to labor saving in the semiconductor device design, manufacture and evaluation sections. In addition, the resimulations from the manufacture results permit further labor saving.

According to a seventh aspect of the present invention, the semiconductor device development information integrating system of the first or second aspect has a feature that said database registers (i) a model data for each semiconductor device type and each process step and (ii) a duplicate information between the semiconductor device design and manufacture sections as integrated information.

It is therefore unnecessary to perform manual condition settings to automated systems, leading to labor saving in the semiconductor device design, manufacture and evaluation sections. In addition, the integration of the duplicate information permits further labor saving.

According to an eighth aspect of the present invention, the semiconductor device development information integrating system of the second aspect has a feature that said CAD system captures thickness information of a semiconductor device, to designate the Z axis of a three dimensional CAD system and obtain device simulation information.

It is therefore unnecessary to perform manual condition settings to automated systems, leading to labor saving in the semiconductor device design, manufacture and evaluation sections. In addition, the information acquisition of the Z axis and the device simulation permits further labor saving.

According to a ninth aspect of the present invention, the semiconductor device development information integrating system of the second aspect further comprises a semiconductor device evaluation system for evaluating the semiconductor device, said evaluation system capturing the CAD information of said CAD system to designate coordinate values during on-wafer evaluation.

It is therefore unnecessary to perform manual condition settings to automated systems, leading to labor saving in the semiconductor device design, manufacture and evaluation sections. In addition, the designation of the coordinate values during on-wafer evaluation permits further labor saving.

BRIEF DESCRIPTION OF THE DRAWINGS

FIGS. 4(a) and 4(b) constitute a diagram showing a case where a photomask specification created in a semiconductor device design section is called from a database to an electronic terminal.

FIG. 7 is a diagram showing a process list in a semiconductor device manufacture.

FIGS. 16(a) and 16(b) are diagrams showing a format of information interchange among design, manufacture and evaluation sections in conventional semiconductor device development.

DETAILED DESCRIPTION OF THE PREFERRED EMBODIMENTS

Embodiment 1

Figure 1:
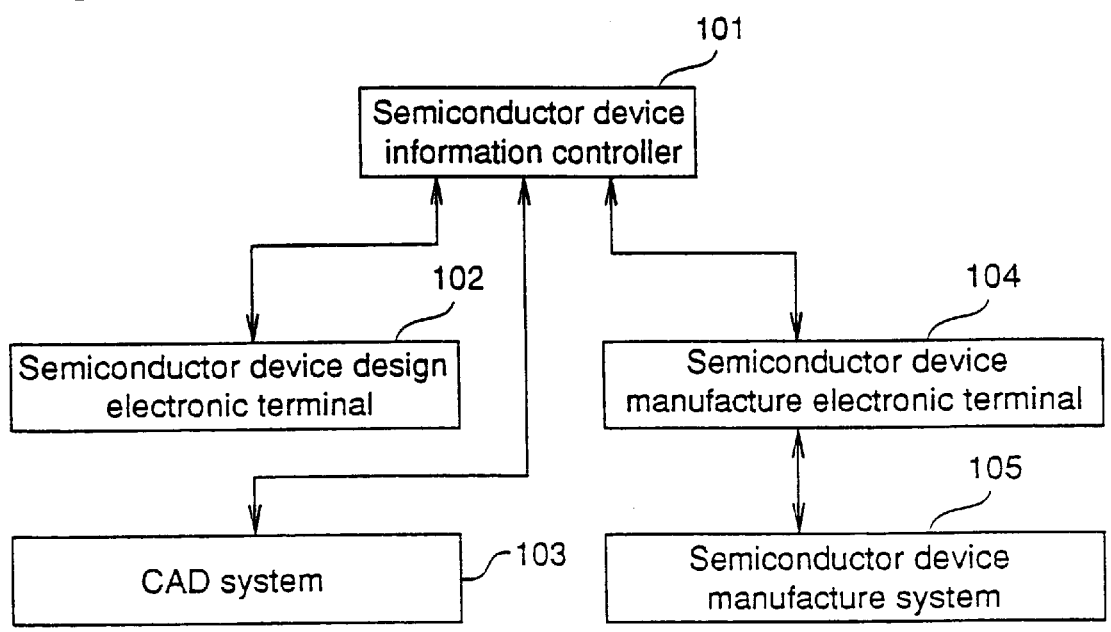
FIG. 1 is a diagram showing a construction of a semiconductor device development information integrating system according to a first embodiment of the present invention.

FIGS. 2(a) and 2(b) show a schematic construction of a semiconductor device development information integrating system according to Embodiment 1 of the present invention. In FIG. 2(a), there are shown a database 1 storing information created at a design section, a database 2 storing information created at a manufacture section, and a database 3 storing information created at an evaluation section. Information acquisition means 1a accesses not only the database 1 but the databases 2 and 3, to acquire manufacture and evaluation information as well as design information. The acquired information is then delivered to the design section, in which the automatic design for a target semiconductor device is executed based on the information. Information acquisition means 2a accesses not only the database 2 but the databases 1 and 3, to acquire design and evaluation information as well as manufacture information. The acquired information is then delivered to the manufacture section, in which the automatic manufacture of the target semiconductor device is executed based on the information. Information acquisition means 3a accesses not only the database 3 but the databases 1 and 2, to acquire design and manufacture information as well as evaluation information. The acquired information is then delivered to the manufacture section, in which the automatic manufacture is executed based on the information. These information acquisition means are implemented by software that accesses databases 1, 2 and 3.

Referring to FIG. 2(b), the design section is provided with an engineering workstation (EWS) 10 having a graphic terminal 10a, a memory 10b and a submemory 10c, and a server 100 having a memory 100a and a submemory 10b. The manufacture section is provided with an EWS 20 having a graphic terminal 20a, a memory 20b and a submemory 20c, and a server 200 having a memory 200a and a submemory 200b.

In the development of a semiconductor device, the design information created at the design section is stored in the database 1 that is implemented on the server 100. Utilizing the design information, the design section, as required, creates, sets and retrieves information requisite for the semiconductor device design, such as alignment creations, the normal/reverse photomask type, capacitance values, resistance values and current values, by watching a list, e.g., papers and terminal screens, which list is retrievable using the EWS 10.

Manufacture information created at the manufacture section is stored in the database 2 that is implemented on the server 200. Utilizing the manufacture information, the manufacture section, as required, creates, sets and retrieves information requisite for the semiconductor device manufacture, such as systems to be used, mask names, coordinates set to the systems, processing time and lot names, by watching a list, e.g., papers and terminal screens, which list is retrievable using the EWS 20.

Manufacture information created at the evaluation section is stored in the database 3 that is implemented on a server (not shown). Utilizing the manufacture information, the evaluation section, as required, creates, sets and retrieves information requisite for the semiconductor device evaluation, such as chip names, pads, coordinate values of TEGs, measurements of monitor TEGs during the manufacture and design specifications, by watching a list, i.e., papers and terminal screens, which list is retrievable using an EWS (not shown).

It is noted that the aforementioned database integration is attained by linking servers so that in the information interchange the inter-server access is limited to mutually permissible items.

Figure 15:
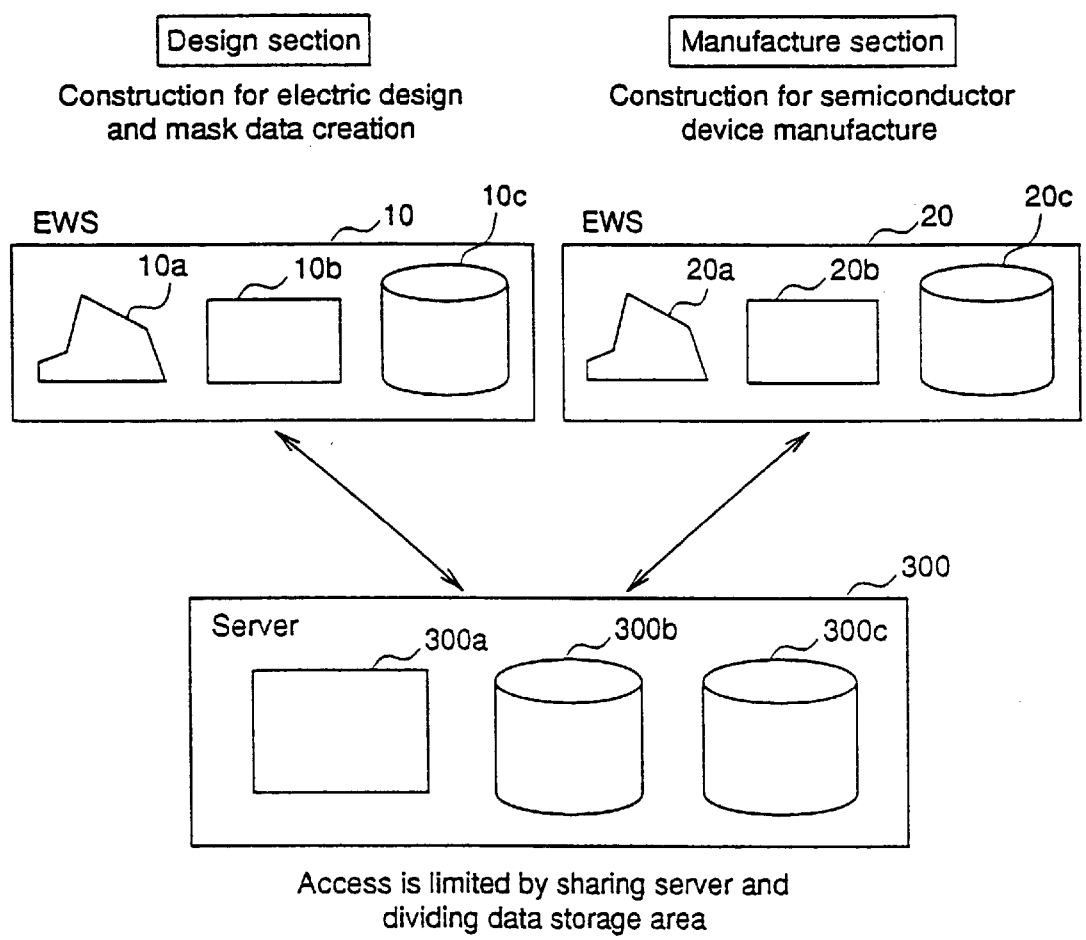
FIG. 15 is a diagram showing another schematic construction of the semiconductor device development information integrating system of the first embodiment.
Figure 17:
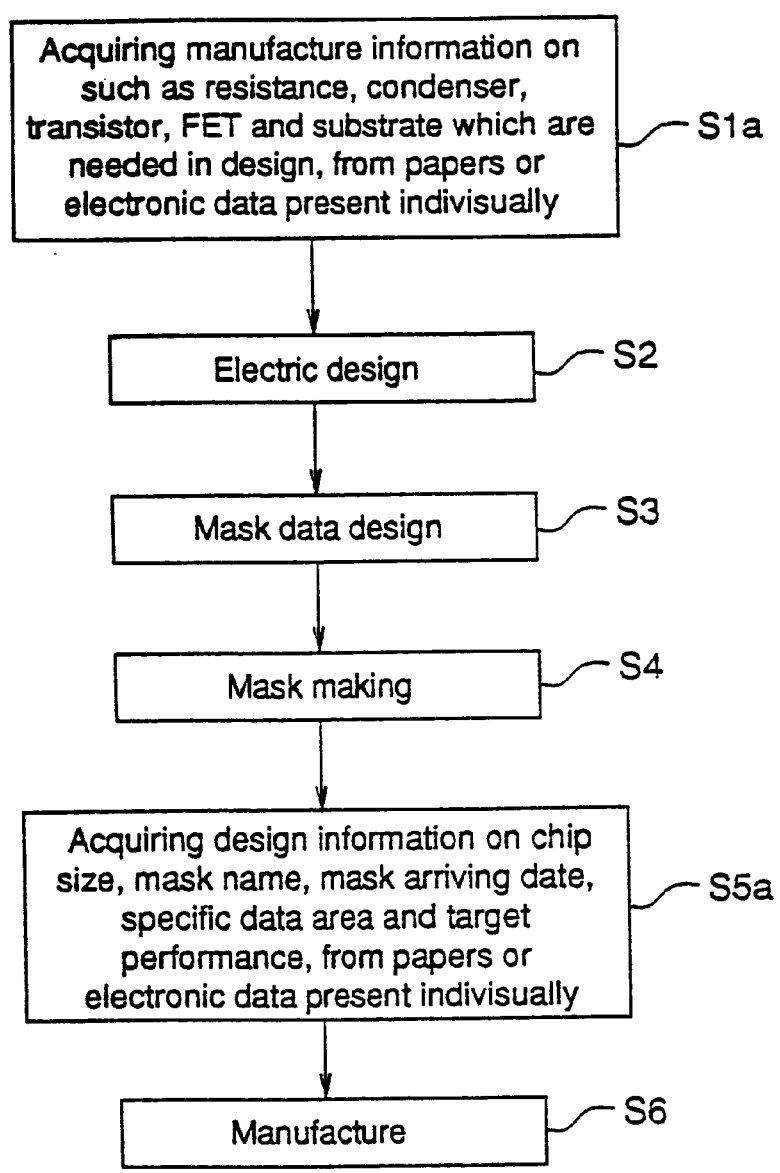
FIG. 17 is a flowchart showing a development process in a conventional semiconductor device development section.

It is also noted that in the above semiconductor device development information integrating system, although the design and manufacture sections have the respective servers, both servers may be integrated as shown in FIG. 15.

Referring to FIG. 15, a server 300 is shared between the design and manufacture sections and has a memory 300a and submemories 300b, 300c. The data storage areas of the server 300 are divided so as limit the access, enabling to share the server 300 between the design and manufacture sections.

FIG. 1 shows a construction of the semiconductor device development information integrating system of Embodiment 1. There is shown a semiconductor device information management system 101, in which electronic data on the photomask specifications created in the semiconductor device design process and electronic data on the respective manufacture process steps created in the semiconductor device manufacture process, are stored and managed as integrated semiconductor device information that is integrated into a single or plural databases. The semiconductor device information management system 101 is implemented on the servers 100 and 200 shown in FIG. 2(b), or the server 300 shown in FIG. 15. A semiconductor device design electronic terminal 102 is used to issue a request to the semiconductor device information management system 101 to call and display the integrated semiconductor device information and to create and edit design data based on the information. The semiconductor device design electronic terminal 102 is implemented on the EWS 10 shown in FIG. 2(b) or FIG. 15. A CAD system 103 of the semiconductor device design section is used to issue a request to the management system 101 to acquire information. The CAD system 103 is implemented on the EWS 10 in FIG. 2(b) or FIG. 15. A semiconductor device manufacture electronic terminal 104 is used to issue a request to the management system 101 to call and display the integrated semiconductor device information and to create and edit manufacture data based on the information. The semiconductor device manufacturing electronic terminal 104 is implemented on the EWS 20 in FIG. 2(b) or FIG. 15. A semiconductor manufacture system 105 is used to automatically manufacture a semiconductor device based on the manufacture data created and edited by the electronic terminal 104.

The semiconductor device information management system 101 stores and manages the electronic data of the photomask specifications created in the semiconductor device design and the electronic data of the respective manufacture process steps created in the semiconductor device manufacture process, as the integrated semiconductor device information integrated into a single or plural databases. The semiconductor device design electronic terminal 102 issues a request to the management system 101 to call and display the integrated semiconductor device information and, based on that information, creates and edits design data. The CAD system 103 issues a request to the management system 101 to acquire information. The semiconductor device manufacture electronic terminal 104 issues a request to the management system 101 to call and display the integrated semiconductor device information and, based on that information, creates and edits manufacture data. The semiconductor device manufacture system 105 automatically manufactures a semiconductor device based on the manufacture data created and edited by the electronic terminal 104.

In the semiconductor device development information integrating system so constructed, the semiconductor device design section aims to provide photomasks with the manufacture section, except for some direct drawing process steps which are designed to satisfy desired semiconductor device performances. Recently, the number of masks used in semiconductor device manufacture is normally from more than ten to more than twenty, and the manufacture is completed through more than twenty process steps per mask. Hence, Embodiment 1 aims to realize the integration of the design information and the manufacture information which have been divided by the delivery of photomasks, by integrating the access modes to the databases.

Specifically, in order to integrate the databases, electronic data linked to the address names of information is stored in areas capable of storing the electronic data for each of the semiconductor device design, manufacture and evaluation sections. The input and edition of information is executed in each section by personal computers, EWSs and the like. Information from the databases is retrieved on a network by personal computers, EWSs and the like, for mutual information references.

More specifically, the retrieval is performed utilizing electronic data along with the mask names created in the semiconductor device design, or overall process names called in the semiconductor device manufacture process, as addresses for access to the databases which are integrated or individually stored in plural areas, thereby avoiding a pretense of interfaces so that the databases are seen as one integrated database. Alternatively, the mask names for each semiconductor device type, semiconductor device names used in the semiconductor device manufacture and lot names are set as retrieval references, and then expanded into the succeeding photomasks and overall process names.

Subsequently there is acquired information on the photomask type, i.e., normal or reverse, accuracies and the like, which information is needed in the semiconductor device manufacture section, and information on alignment mark types, photomask alignment sequences and the like, which information is needed in the systems employed in photolithography steps of the semiconductor device manufacture. The information is then connected to the automated systems in the semiconductor device design and manufacture, such as automatic patterning, and therefore, the automatic settings to such automated systems result in labor saving.

A description will be given of a semiconductor device design. Photomask designs in a semiconductor device design aim to create the electronic data for manufacturing photomasks employed in the development of semiconductor devices capable of satisfying desired performance. In the creation of such electronic data, plural layers, i.e., the overall layers of each semiconductor device type, are designed at one time. Therefore, in general, a list of photomasks to be created is previously prepared and the design is executed by referring to the list. In the semiconductor device design process of Embodiment 1, a list of photomasks is created, edited and stored as electronic data, followed by database construction. Then, based on the information referenced from the database, the electronic data for creating photomasks and verification rules are automatically created.

The following items are registered in the databases of Embodiment 1.

Design information comprising:

Mask names;

Mask type, i.e., normal or reverse;

Mask sizes;

Plotting speeds of masks;

Minimum pattern widths within masks;

Layers of CAD data for creating masks;

Glass materials of masks, shielding film materials or their corresponding product names;

Subnumbers of masks;

Mirror images of masks;

Alignment information of masks;

Shots and cell sizes of masks;

Mask designers;

Started and completed dates of mask making; and

Mask JOBDECs, i.e., procedure specifications;

Process information comprising:

Process lists;

Mask names;

Sheet resistances;

Capacitance values of condensers;

Current values of transistors, FETs, etc.;

Progress states of the process;

Substrate materials:

Substrate thicknesses and permittivities;

Metal resistance values;

Active layer resistance values;

Contact resistance values;

Transistor current values;

Transistor threshold values; and

Mutual conductance

Utilizing the database having the aforementioned data as a field, data interchange between the design and manufacture sections can be performed on-line.

Figure 3:
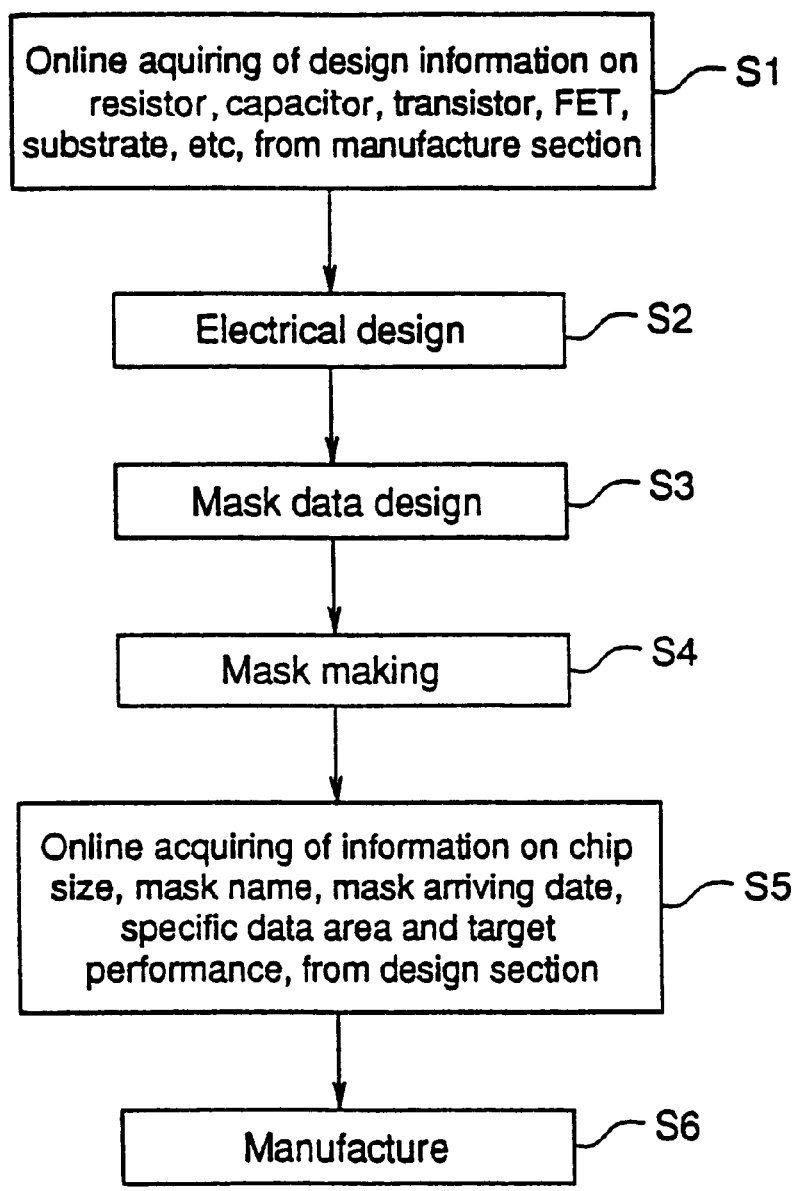
FIG. 3 is a diagram showing a development process in a semiconductor device development section, which development is carried out utilizing the semiconductor device development information integrating system of the first embodiment.

FIG. 3 shows a development process in the semiconductor device development section, which process is performed utilizing the semiconductor device development information integrating system as described.

In step S1, design information for, for example, resistors condensers, transistors, FETs and substrates, is acquired on-line from the manufacture section. In step S2, electrical design is executed using the manufacture information obtained in step S1. In step S3, mask data design is executed. In step S4, mask making is executed. In step S5, information on, for example chip sizes, mask names, mask arriving dates, specific data areas and target performances, is acquired from the design section. In step S6, mask manufacture is executed using the design information obtained in step S5.

FIG. 4(a) shows a case where a photomask specification to be created in the semiconductor device design is called from the database to the electronic terminal. The various instructions in FIG. 4(a) have the following meaning:

"M—" in item a: a mask for a mirror projection system,

"MM01A" in item b: a mask name,

"—P4" in item c: a process name using the mask,

"39" in item d: a CAD layer name,

"—A" in item e: a subnumber,

"P" in item f: a process using a positive resist,

"IR" in item g: a reverse mask,

"5" in item h: a mask size,

"0.5" in item i: an address unit, 0.5 μm in size,

"NO" in item j: not being mirror image,

"3±0.2" in item k: a check pattern width, 3±0.2 μm,

". . ." in item 1: a layer of a parent mark,

"CORE" in item m: a drawing system name, and a symbol in item n: an ordered subnumber corresponding to "A".

It should be noted that although FIG. 4(a) shows the instance of one layer alone, in practice, the instructions for plural layers are present. FIG. 4(b) shows ASCII data being stored in the database as shown in FIG. 4(a). The various instructions in FIG. 4(b) have the following meaning:

"Ga1" in item X1: a group name to which a mask designer belongs,

"mmatuura" in item X2: a name of the mask designer,

"465" in item X3: an extension number of the mask designer,

"96.02.27" in item X4: the mask designed date,

"mm01aaa" in item X5: a cell name,

"7980" in item X6: a side length of a chip,

"8000" in item X7: the other side length of a chip,

"mm01ata" in item X8: a cell name,

"7980" in item X9: a side length of a chip,

"8000" in item X10: the other side length of a chip,

"mm01ama" in item X11: a cell name,

"7980" in item X12: a side length of a chip,

"8000" in item X13: the other side length of a chip,

"mm01asa" in item X14: a cell name,

"7980" in item X15: a side length of a chip,

"8000" in item X16: the other side length of a chip,

"96.02.21" in item X17: a date,

"MIR" in item X18: being a master mask,

"M—" in item X19: a mask for a mirror projection system,

"P4" in item X20: a process name using the mask,

"39" in item X21: a CAD layer name,

"A" in item X22: a subnumber,

"P" in item X23: a positive resist process,

"R" in item X24: a reverse mask,

"5" in item X25: a mask size,

"0.5" in item X26: an address unit, 0.5 μm in size,

"NO" in item X27: not being mirror image,

"3.00", "0.2" in items X28, X29: a check pattern width, 3±0.2 μm,

"G1" in item X30: a layer of a parent mark,

"CORE" in item X31: a drawing system name, and

"nil" in item X32: no symbol corresponds to this item.

It should be noted that the items X19 to X31 in FIG. 4(b) correspond to the items a to m in FIG. 4(a).

Accordingly, the feature that the data of the table in FIG. 4(a), which data is to be registered in the design section, is stored on ASCII data as shown in FIG. 4(b), allows computers to function compatibly with one another, causing no character errors associated with the communications among the computers.

Figure 5:
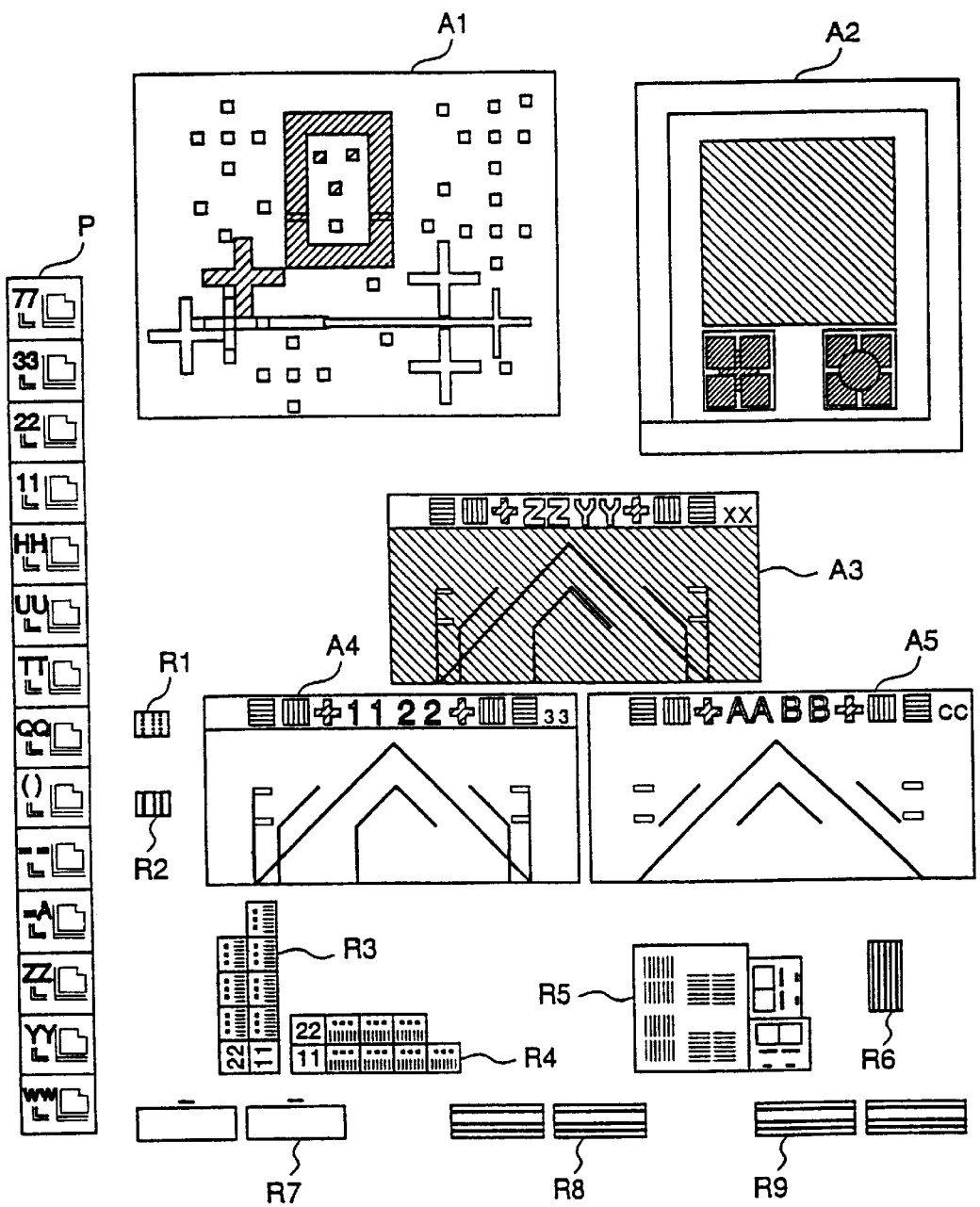
FIG. 5 is a diagram showing a case where an alignment group is automatically created from a format as shown in FIG. 4.

In exposure systems for photolithography steps in the semiconductor device manufacture, it is necessary to create, on a photomask, an alignment mark that has been agreed among exposure system manufacturers. FIG. 5 shows a case where an alignment group is automatically created from the format shown in FIG. 4(a). In FIG. 5, there are shown master alignment marks A1 and A2, which marks are inherent in exposure systems. Master alignment marks A3 to A5 are recommended by the exposure system manufacturers in their catalogs. R1 to R9 designate reticle marks, and P designates development check patterns for checking the resists on wafers.

Figure 6:
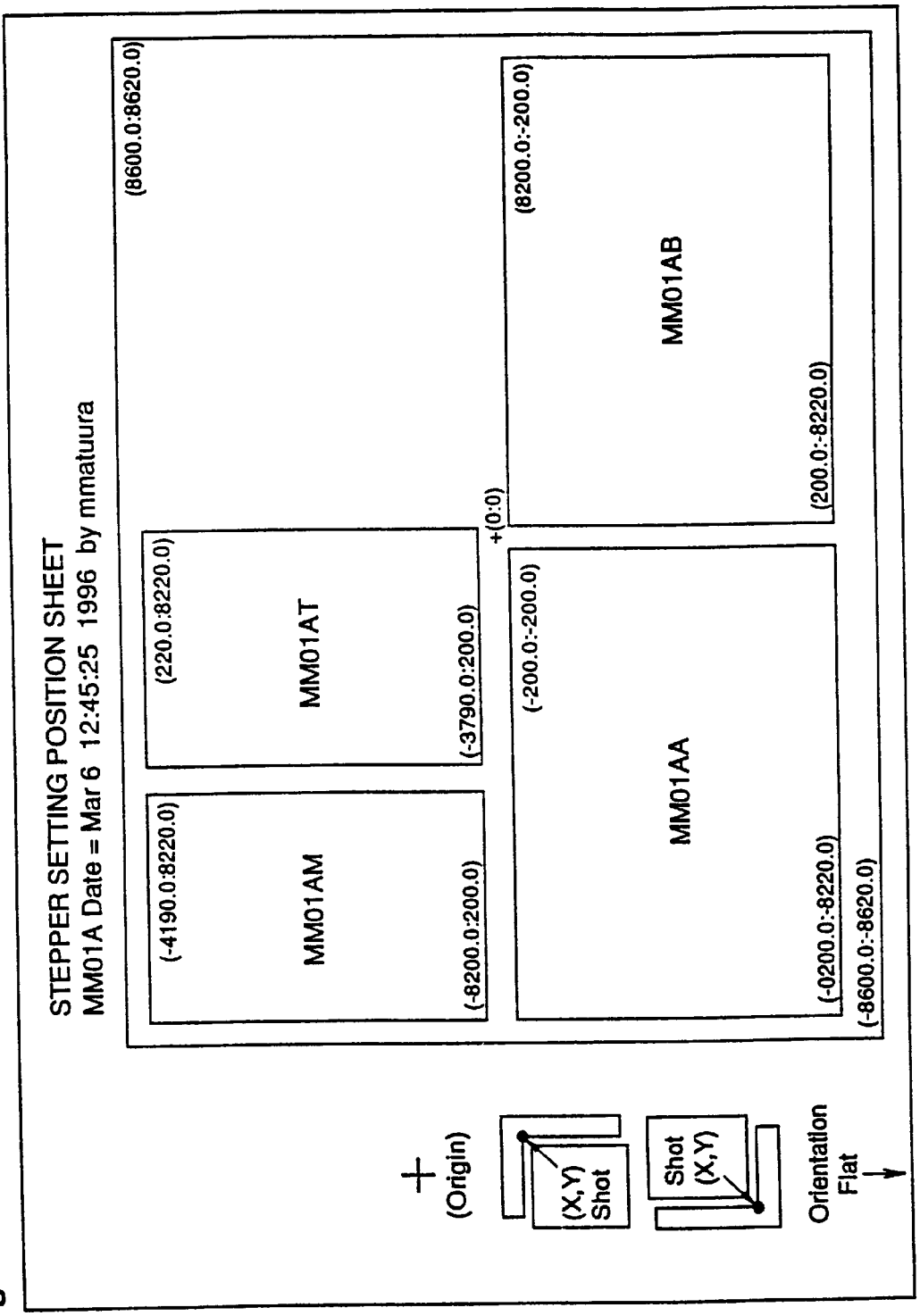
FIG. 6 is a diagram showing a case where coordinate values to be set in an exposure system for photolithography in a semiconductor device manufacture step is extracted over a CAD system.

FIG. 6 shows a case where coordinate values for setting an exposure system for photolithography in the semiconductor device manufacture is sampled on a CAD system. In FIG. 6, plural chip patterns of "MM01AM", "MM01AT", "MM01AA" and "MM01AB" are formed on the wafer.

A description will be given of the semiconductor device manufacture. FIG. 7 shows only one process step out of a process list for manufacturing the semiconductor device. In order to acquire information on mask names, alignment mark coordinates and the like, the list of photomasks that has been used in the design section is referenced from the database. This corresponds to an indication shown by "A" in FIG. 7, and the items a to f in FIG. 4(a) are referenced here. The item "B" indicates a solvent, processing time and the like in the semiconductor device manufacture.

Therefore, in the semiconductor device manufacture, the setting of such as the transport of specification masks is performed based on the process list that has been converted into electronic data.

It should be noted that in the semiconductor device evaluation, mutual utilization of the database is performed as in the cases with the semiconductor device design and manufacture.

A method of constructing the database will be described. Data is stored in a memory connected by wires or by radio, which memory is able to be monitored, for controlling corrections, updates and the like, through a submemory, such as a personal computer or EWS. In order to share the database, numerical values and character information are described in binary data or ASCII data, so that the same numerical values and the same character information can be reconstructed between the same or different types of computers. It is essential to utilize a database management system that supports a security function controlling corrections and updates of the database.

Thus according to Embodiment 1, in the semiconductor device information management system, electronic data for photomask specifications to be created in semiconductor device design and electronic data for each manufacture process step in the semiconductor device manufacture process, are stored and managed as the integrated semiconductor device information that is integrated into a single or plural databases. A semiconductor device design electronic terminal issues a request to the management system to call and display the integrated semiconductor device information. Based on the information thus displayed, design data is created and edited, while the CAD system issues a request to the management system to call the integrated information, thereby obtaining the integrated semiconductor device information. Then, the semiconductor device manufacture electronic terminal issues a request to the semiconductor device information management system to call and display the integrated information, based on which information, manufacture data is created and edited. The manufacture data is then transmitted to the manufacture system to manufacture a semiconductor device automatically. It is therefore unnecessary to supply condition settings to automated systems manually, leading to labor saving in semiconductor device design, manufacture and evaluation sections.

Embodiment 2

Figure 8:
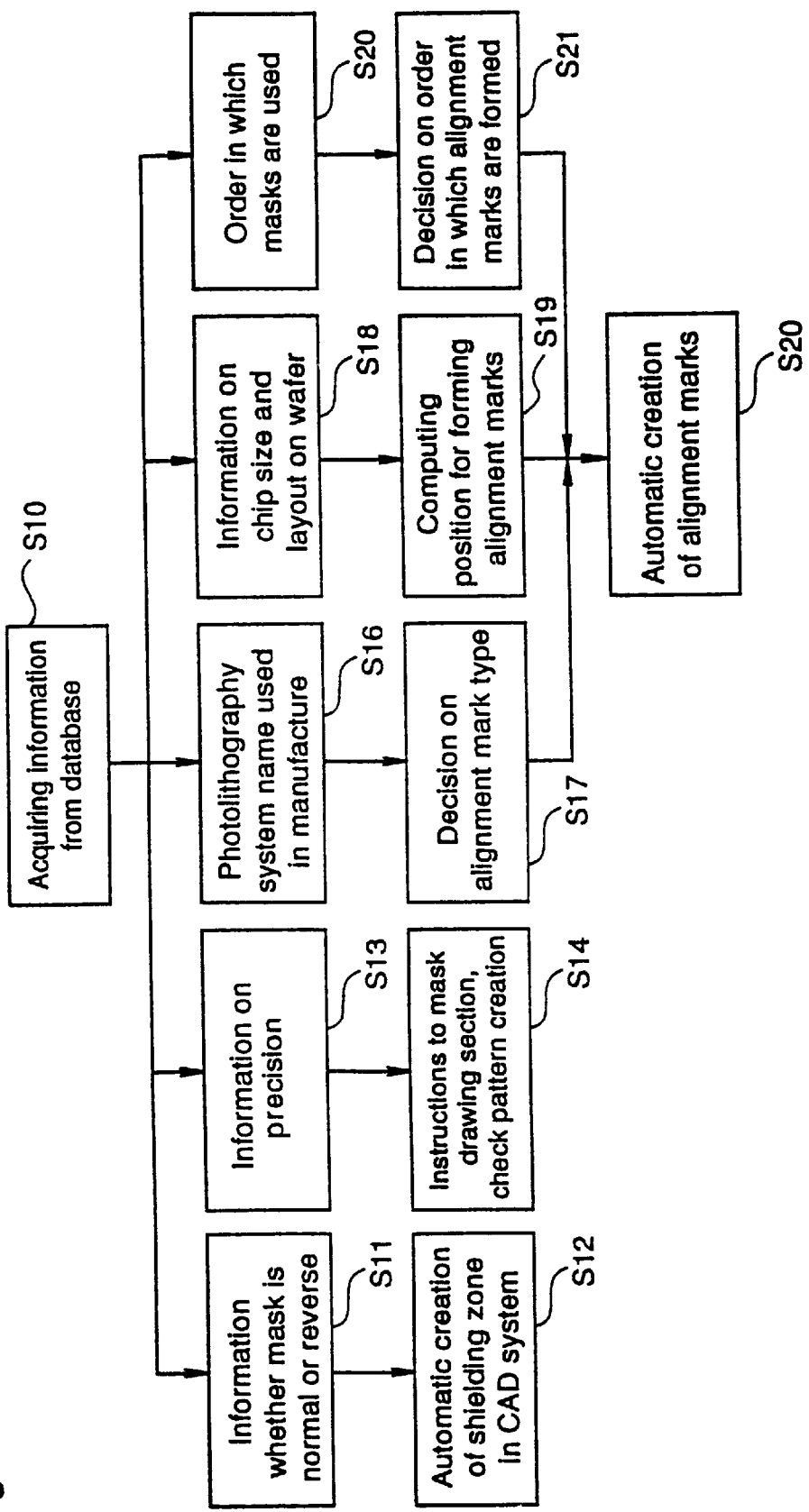
FIG. 8 is a flowchart showing processing executed by a CAD system in a second embodiment.

Although a detailed description of an EWS (CAD system), particularly in the semiconductor device design section, is omitted in Embodiment 1, such an EWS is to execute, as shown in FIG. 8, automatic patterning by acquiring information on such as precision and the photomask type, i.e., normal or reverse, which information is requisite for the semiconductor device manufacture section, and information on such as the types of alignment marks and the alignment sequences of photomasks, which information is requisite for the systems in the photolithography steps in semiconductor device manufacture.

Referring to FIG. 8, step S10 acquires information from the database. Step S11 acquires information as to whether a mask is normal or reverse, from the information obtained in step S10. Step S12 decides whether a light shielding zone is automatically created in the CAD system. Step S13 acquires precision information from the information obtained in step S10. Step S14 sends instructions to a mask drawing section and creates check patterns based on the precision information.

Step S16 acquires the names of photolithography systems used in the semiconductor device manufacture from the information obtained in step S10. Step S17 decides the alignment mark types based on the acquired system names. Step S18 acquires information on chip sizes and the layouts on wafers, from the information obtained in step S10. Step S19 calculates the positions for forming alignment marks based on the chip sizes and the layout thus obtained. Step S20 acquires the order in which the masks are used, from the information obtained in step S10. Step S21 decides the order in which the alignment marks are formed, based on the order of the masks. Step S22 executes the automatic creation of the alignment marks, based on the positions of the alignment marks computed in step S19 and the order of the alignment marks decided in step S21.

Figure 2:
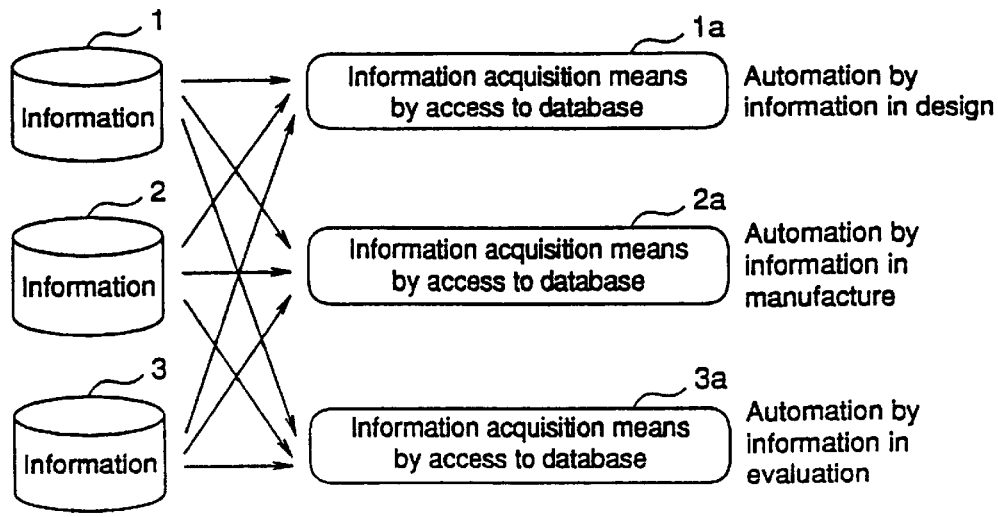
FIGS. 2(a) and 2(b) are diagrams showing a schematic construction of the semiconductor device development information integrating system of the first embodiment.
Figure 2:
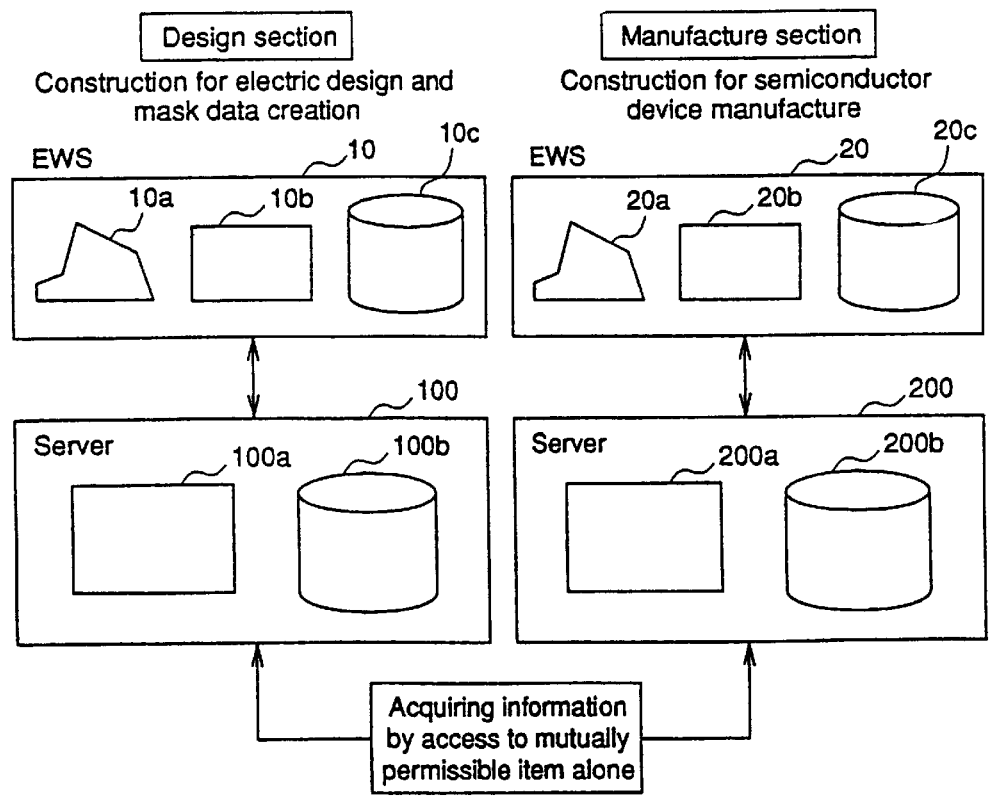

Referring to FIG. 2, it is noted that the CAD system has a CPU (not shown), in addition to a graphic terminal 10a, a memory 10b and a submemory 10c. The automatic patterning is executed by the CPU performing the following operations.

Specifically, in step S10, various kinds of information is acquired from the database that is shared between the semiconductor device manufacture and design sections. In Step S31, information as to whether the mask is normal or reverse is acquired out of the information obtained in step S10. In step S12, it is decided whether the mask is normal or reverse and, when it is reverse, a light shielding zone is automatically created, and when it is normal, no light shielding zone is created.

In step S13, precision information is acquired from the information obtained in step S10. In step S14, instructions are sent to the mask drawing section and check patterns are created based on the precision information.

In step S16, the names of photolithography system used in the semiconductor device manufacture are acquired from of the information obtained in step S10. In step S17, the alignment mark types are decided based on the acquired system names.

In step S18, information on chip sizes and the layouts on wafers is acquired from the information obtained in step S10. In step S19, the positions in which the alignment marks are formed is computed based on the chip sizes and the layouts thus obtained.

In step S20, the order in which masks are used is acquired from of the information obtained in step S10. In step S21, there is decided the order in which the alignment marks are formed, based on the order of the masks.

In step S22, referring to the alignment mark types decided in step S19, and the order of the alignment marks decided in step S21, the alignment marks are automatically created.

Thus in Embodiment 2, the CAD system can automatically generate patterns, such as alignment marks, by referring to the database that is shared between the semiconductor device design and manufacture sections. This leads to the semiconductor device development information integrating system that is further advantageous to labor saving in semiconductor device design.

Embodiment 3

The CAD system may automatically create verification rules in semiconductor device design and then perform the verification rules.

Figure 9:
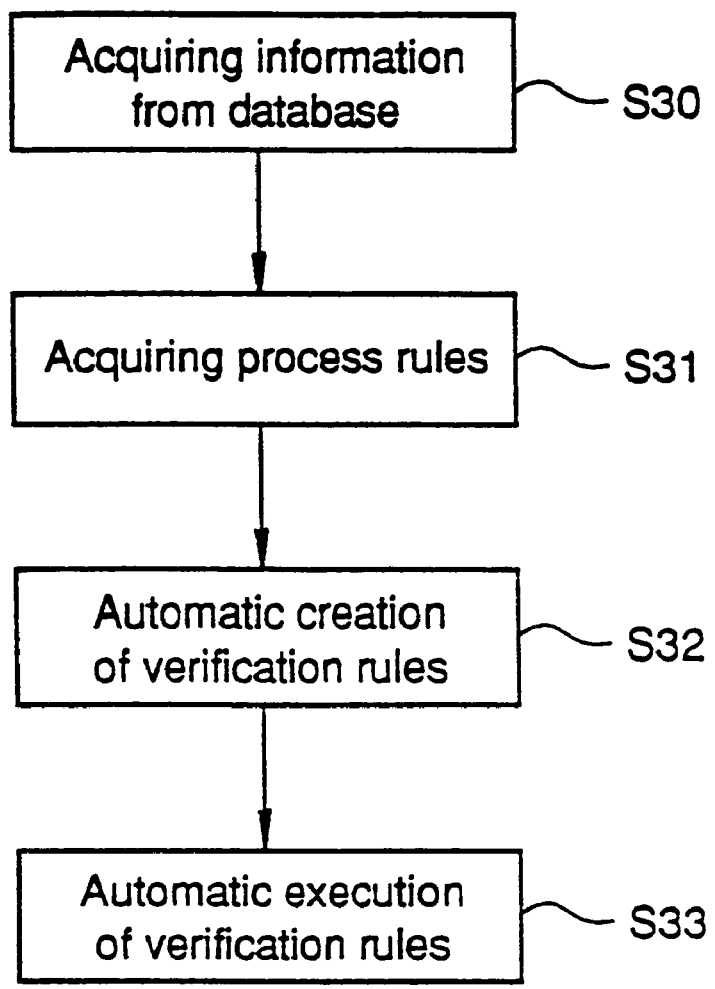
FIG. 9 is a flowchart showing processing executed by a CAD system in a third embodiment.

Referring to FIG. 9, step S30 acquires information from the database, step S31 acquires process rules from the information obtained in step S30, step S32 automatically creates verification rules based on the process rules, and step S33 automatically performs the verification rules.

The CPU in the CAD system acquires, in step S30, various kinds of information from the database shared between the semiconductor device design and manufacture sections. In step S31, the process rules including wire widths and inter-wire gaps, which rules are needed in the semiconductor device manufacture section, are acquired from the information obtained in step S30. In step S32, the verification rules are automatically created based on the process rules. In step S33, the verification rules are automatically performed.

Thus in Embodiment 3, the CAD system can automatically create and perform the verification rules by referring to the database that is shared between the semiconductor device design and manufacture sections. This leads to the semiconductor device development information integrating system that is further advantageous to labor saving in semiconductor device design.

Embodiment 4

Figure 10:
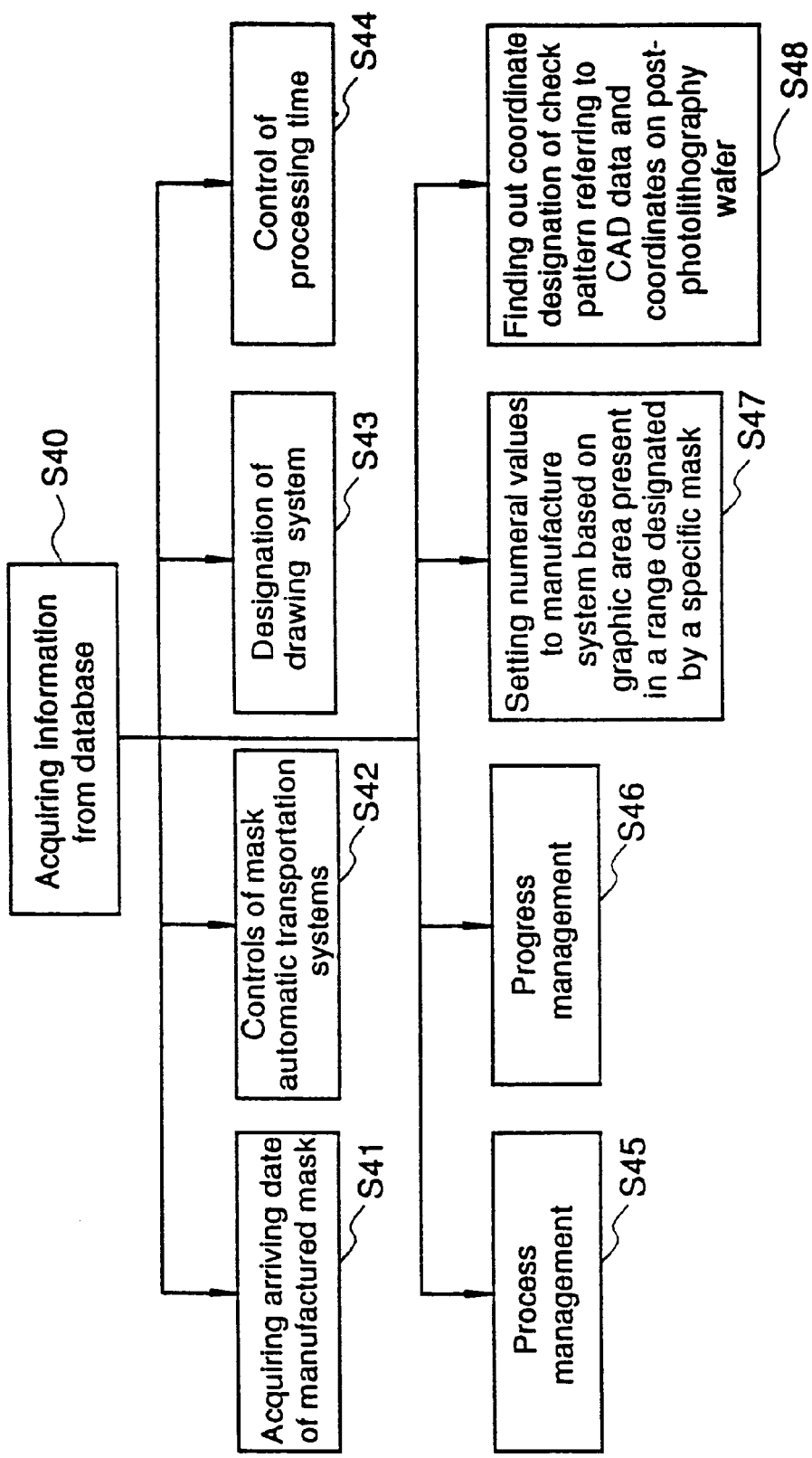
FIG. 10 is a flowchart showing processing executed by a semiconductor device manufacture system in a fourth embodiment.

The automated semiconductor device manufacture system may have a function to find out when mask makings are started and when the mask manufacture is completed, as shown in FIG. 10.

Referring to FIG. 10, step S40 acquires information from the database. Step S41 acquires the arriving dates of manufactured masks from the information obtained in step S40. Step S42 control the mask automatic transportation systems based on the information obtained in step S40. Step S43 specifies drawing systems based on the information obtained in step S40. Step S44 controls the processing time based on the information obtained in step S40. Step S45 executes process management based on the information obtained in step S40. Step S46 executes the progress management based on the information obtained in step S40. Step S47 executes the numeral settings to the manufacture system based on graphic areas existing in a range designated by a specific mask. Step S48 computes the designations of the coordinates of check patterns by referring to the CAD data and the coordinates on wafers after being subjected to the photolithography steps, based on the information obtained in step S40.

The semiconductor device manufacture system has a CPU for its automated manufacture processing. The CPU acquires, in step S40, various kinds of information from the database shared between the semiconductor device design and manufacture sections. In step S41, the arriving dates of manufactured masks are acquired from the data obtained in step S40. In step S42, the mask automatic transportation systems are controlled, based on the data obtained in step S40, so that masks to be used are taken out and then transported. In step S43, drawing systems are designated based on the process types and the mask names obtained in step S40. In step S44, the processing time is managed based on the data obtained in step S40. In step S45, the process is managed based on the data obtained in step S40. In step S46, the progress is managed based on the data obtained in step S40. In step S47, numeral values are set to the manufacture system using the graphic areas existing in a range designated by a specific mask, based on the data obtained in step S40. In step S48, the designations of the coordinates of check patterns are found out by referring to the CAD data and the coordinates on the wafer after being subjected to the photolithography steps, based on the data obtained in step S40, thereby deciding where the check patterns exist.

Thus in Embodiment 4, referring to the database shared between the semiconductor device design and manufacture sections, the semiconductor device manufacture system automatically obtains the information on the arriving dates of the manufactured masks, the controls of the mask automatic transportation systems, the designations of the drawing systems, the management of the processing time, process and progress, the numerical setting to the manufacture system, and the designations of the coordinates of the check patterns. It is therefore able to find out automatically information as to when mask makings are started and when the masks are completed. This leads to the semiconductor device development information integrating system that is further advantageous to labor saving in semiconductor device manufacture.

Embodiment 5

The CAD system may perform resimulations from the results of the semiconductor device manufacture, in the semiconductor device design process.

Figure 11:
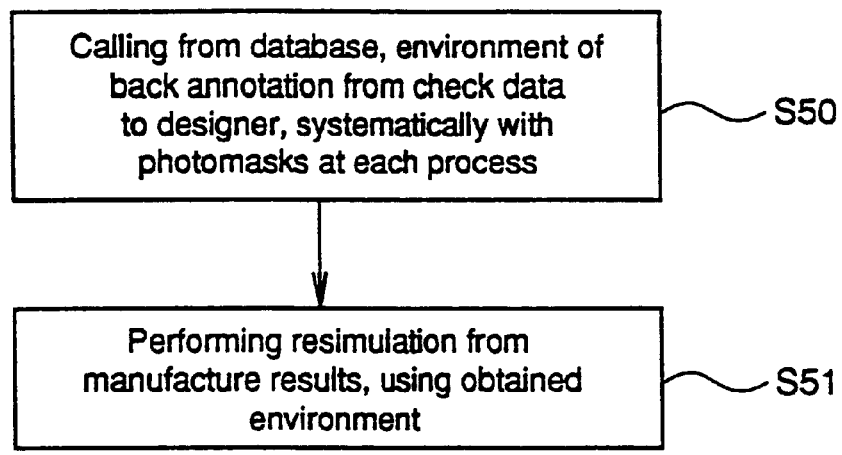
FIG. 11 is a flowchart showing processing executed by a CAD system in a fifth embodiment.

Referring to FIG. 11, step S50 calls, from the database, the environment in which the back annotations from the check data to a designer is performed, process by process, systematically with the photomasks. Step S51 performs the resimulations from the manufacture results using the aforesaid environment.

The CAD system has a CPU. In step S50, the CPU calls, from the database, the environment in which the back annotations from the check data from after/during the manufacture process to a design is performed, process by process, and systematically with the photomasks. In step S51, the resimulations from the manufacture results are performed using the aforesaid environment.

Thus in Embodiment 5, referring to the database shared between the semiconductor device design and manufacture sections, the CAD system acquires check data from after/during the manufacture process, facilitating the resimulations from the manufacture results. Taking an example of a square 10 μm in side, when having a sheet resistance of 200Ω, a side of the square may extend and the resistance will change to 250Ω or 180Ω or the like. However, by returning such a value to a designed value, a precise resistance is obtainable. Furthermore, the aforementioned resimulations are usable to control the capacitances of condensers and current values of FETs.

Embodiment 6

In the database of the semiconductor device development information integrating system, model data for each semiconductor device type and for each process step may be registered, and duplicate information between the design and manufacture sections may be integrated and registered.

Figure 12:
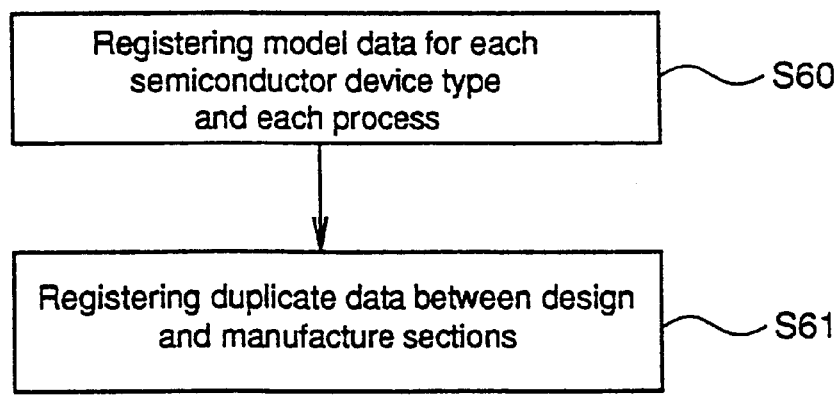
FIG. 12 is a flowchart showing processing executed by a semiconductor device development information integrating system in a sixth embodiment.

Referring to FIG. 12, step S60 registers the aforementioned model data in the database of the semiconductor device development information integrating system, and step S61 integrates and registers the aforesaid duplicate information.

The server of the semiconductor device development information integrating system has a CPU. In step S60, the CPU registers the aforesaid model data in the database implemented on a submemory of the CPU. In step S61, the aforesaid duplicate information is integrated and registered.

Thus in accordance with Embodiment 6, the efficiency of information creation work it is improved because, in the database of the semiconductor device development information integrating system, the model data for each semiconductor device type and each process step is registered and the duplicate information between the design and manufacture sections is integrated and registered. In addition, the feature that the process is standardized in a single manufacture line facilitates the process management. For example, when the manufacture line contains ten process steps, all the steps may be registered in the semiconductor device development information integrating system and then properly selected when required.

Embodiment 7

The CAD system is able to acquire information on the designations of the Z axis of a three dimensional CAD and device simulations, by capturing semiconductor device thickness information.

Figure 13:
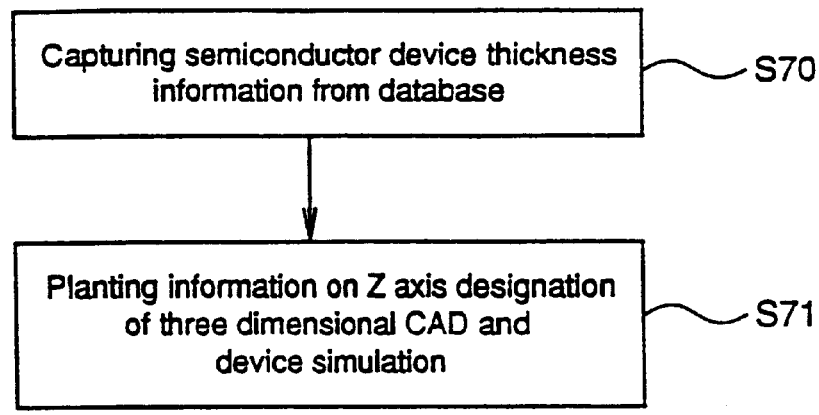
FIG. 13 is a flowchart showing processing executed by a CAD system in a seventh embodiment.

Referring to FIG. 13, step S70 captures the semiconductor device thickness information from the database, and step S71 plants (acquire) the designation of the Z axis of the three dimensional CAD and the device simulations.

The CAD system has a CPU. In step S70, the CPU captures the aforesaid thickness information. In step S71, using the captured information, there is captured information on the designation of the Z axis of the three dimensional CAD and the device simulations.

Thus in Embodiment 7, the database shared between the semiconductor device design and manufacture sections enables the CAD system to capture the semiconductor device thickness information from the database, thereby planting the designation of the Z axis of the three dimensional CAD and the device simulations. As a result, not only two-dimensional wire widths but the thickness in the direction of the Z axis is found, thereby obtaining the electrical properties in three dimension.

Embodiment 8

The semiconductor device evaluation system may execute the designations of coordinate values during on-wafer evaluation by capturing the CAD information from the CAD system.

Figure 14:
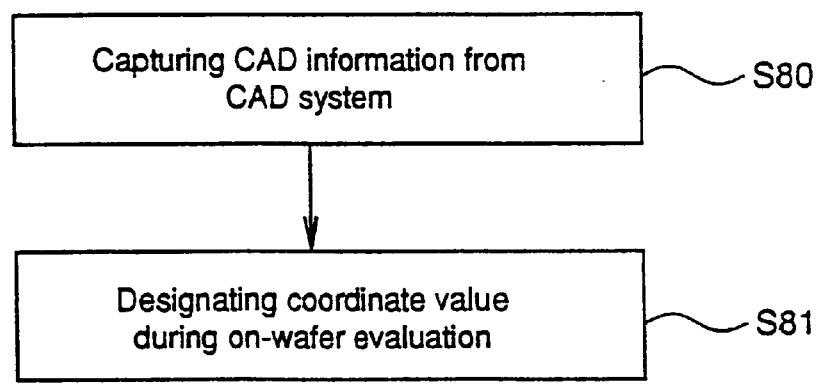
FIG. 14 is a flowchart showing processing executed by a semiconductor device evaluation system in an eighth embodiment.

Referring to FIG. 14, step S80 captures the CAD information from the CAD system, and step S81 designates the coordinates during the on-wafer evaluation, based on the CAD information obtained in step S80.

The semiconductor device evaluation system has a CPU. In step S70, the CPU captures the CAD information from the CAD system. In step S80, the coordinate values during the on-wafer evaluation are designated based on the CAD information obtained in step S80.

Thus in Embodiment 8, the database shared between the semiconductor device design and manufacture sections enables the semiconductor device evaluation system to capture CAD information from the CAD system, thereby designating the coordinate values during the on-wafer evaluation based on the CAD information. This also enables moving a wafer more precisely, as compared with the case in which a stage mounting a wafer is moved at on-wafer evaluation, resulting in more precise on-wafer evaluation.

What is claimed is:

1. A semiconductor device development information integrating system comprising:

a semiconductor device information management system storing and managing (i) electronic data representing photomask specifications created in a semiconductor device design process and (ii) electronic data for manufacturing process steps created in a semiconductor device manufacturing process, as integrated semiconductor device information integrated into a single database the date base registering (i) model data for each semiconductor device type and each process step and (ii) duplicate information for the semiconductor device design process and the manufacturing process;

a semiconductor device design electronic terminal for issuing a request to said management system to call and display the integrated semiconductor device information and, based on the information, create and edit design data;

a semiconductor device manufacture electronic terminal for issuing a request to said management system to call and display said integrated semiconductor device information and, based on the information, create and edit manufacturing data; and a semiconductor device manufacturing system for manufacturing the semiconductor device based on the manufacturing data.

2. A semiconductor device development information integrating system comprising:

a semiconductor device information management system integrating (i) a list produced by converting photomask specifications created in a semiconductor device design section into electronic data (ii) instructions produced by converting manufacturing process steps created in a semiconductor device manufacturing section into electronic data and (iii) a list produced by converting an interim evaluation in a semiconductor device manufacturing process into electronic data, into a single database as integrated semiconductor device information;

an electronic terminal for issuing a request to said management system to call the integrated semiconductor device information, said terminal displaying the device information on a screen of said terminal as a sheet menu and a form menu, process by process, and per string/page, for creating and editing data on said screen for the semiconductor device design and manufacturing sections;

a CAD system for semiconductor device design section, said CAD system receiving said device information when said request is issued; and a semiconductor device manufacturing system receiving the device information when a request is issued.

3. The semiconductor device development information integrating system of claim 2, wherein, in designing a semiconductor device, said CAD system acquires from the database, (i) information on precision and normal/reverse photomask type for the semiconductor device manufacture section and, (ii) information on types of alignment marks and alignment sequences of photomasks for systems used in photolithography steps in semiconductor device manufacturing, thereby executing patterning automatically.

4. The semiconductor device development information integrating system of claim 2, wherein, in designing a semiconductor device said CAD system acquires, from the database, process rules, such as wire widths and inter-wire gaps, requisite for the semiconductor device manufacturing section, to create and execute verification rules automatically.

5. The semiconductor device development information integrating system of claim 2, wherein, in manufacturing a semiconductor device, said semiconductor device manufacture system captures, from the database, information on arriving dates of manufactured masks, controls for mask automatic transportation systems, designations of drawing systems, management of the manufacturing processes, management of processing time, management of progress states, and numerical settings of said manufacturing system according to graphical areas in a range designated by a specific mask, said manufacture system computing coordinates of check patterns by referring to CAD data and coordinates on a wafer after photolithography steps.

6. The semiconductor device development information integrating system of claim 2, wherein in designing a semiconductor device, said CAD system calls, from the database, an environment in which back annotations from check data after or during manufacturing process steps are performed, process by process, and systematically along with photomasks, thereby executing resimulations from the manufacturing results.

7. The semiconductor device development information integrating system of claim 2, wherein the database registers (i) model data for each semiconductor device type and each process step and (ii) duplicate information between the semiconductor device design and manufacturing sections as integrated information.

8. The semiconductor device development information integrating system of claim 2, wherein said CAD system captures thickness information of a semiconductor device to designate a Z axis of a three dimensional CAD system and obtain device simulation information.

9. The semiconductor device development information integrating system of claim 2, comprising a semiconductor device evaluation system for evaluating a semiconductor device, said evaluation system capturing CAD information of said CAD system to designate coordinate values during on-wafer evaluation.

* * * * *